US007851828B2

(12) United States Patent
Cheong et al.

(10) Patent No.: US 7,851,828 B2
(45) Date of Patent: Dec. 14, 2010

(54) PHASE CHANGE MEMORY CELL WITH TRANSPARENT CONDUCTING OXIDE FOR ELECTRODE CONTACT MATERIAL

(75) Inventors: Byung-ki Cheong, Seoul (KR); Jeung-hyun Jeong, Seoul (KR); Dae-Hwan Kang, Seoul (KR); Taek Sung Lee, Seoul (KR); In Ho Kim, Seoul (KR); Kyeong Seok Lee, Seoul (KR); Won Mok Kim, Seoul (KR); Dong-Ho Ahn, Seoul (KR); Ki-Bum Kim, Seoul (KR)

(73) Assignees: Korea Institute of Science and Technology, Seoul (KR); Seoul National University Industry Foundation, Seoul (KR)

( * ) Notice: Subject to any disclaimer, the term of this patent is extended or adjusted under 35 U.S.C. 154(b) by 0 days.

(21) Appl. No.: 11/290,712

(22) Filed: Nov. 29, 2005

(65) Prior Publication Data
US 2006/0113573 A1 Jun. 1, 2006

(30) Foreign Application Priority Data
Nov. 29, 2004 (KR) .................. 10-2004-0098796

(51) Int. Cl.
*H01L 29/768* (2006.01)
(52) U.S. Cl. ................ 257/246; 257/3; 257/4; 257/749
(58) Field of Classification Search ........... 257/246, 257/247, 248, 249, 749, 3, 4; 47/749
See application file for complete search history.

(56) References Cited

U.S. PATENT DOCUMENTS

| 5,462,887 | A | * | 10/1995 | Gluck | .................. 438/158 |
| 6,426,891 | B1 | * | 7/2002 | Katori | .................. 365/175 |
| 6,864,522 | B2 | * | 3/2005 | Krieger et al. | .............. 257/296 |
| 2002/0160553 | A1 | * | 10/2002 | Yamanaka et al. | ........... 438/149 |
| 2005/0035708 | A1 | * | 2/2005 | Yamazaki et al. | ........... 313/505 |
| 2005/0084660 | A1 | * | 4/2005 | Kojima et al. | ............... 428/209 |
| 2006/0233095 | A1 | * | 10/2006 | Iwasa et al. | ................. 369/288 |

FOREIGN PATENT DOCUMENTS

| EP | 1 683 647 | * 10/2004 |
| WO | WO2005/044575 | * 10/2004 |

OTHER PUBLICATIONS

Website document by Ovonyx on GeSbTe thermal alloy conductivity Date Dec. 1999 (p. 17).*
Website document by Umicore on ITO thermal conductivity and electrical reistivity (1 page).*
Website document by Wikipedia about electrical conductivity and electrical resistivity (3 pages).*

(Continued)

*Primary Examiner*—Thinh T Nguyen
(74) *Attorney, Agent, or Firm*—Sughrue Mion, PLLC

(57) ABSTRACT

The present invention provides a non-volatile phase change memory cell containing an electrode contact layer disposed between a metal electrode layer and a phase change material layer, the electrode contact layer being formed of a transparent conducting oxide-based material which has a high electric conductivity, a low thermal conductivity and a good thermal stability. A non-volatile phase change memory cell according to the present invention may be utilized to reduce the electric power needed for reset and set operation.

1 Claim, 10 Drawing Sheets

OTHER PUBLICATIONS

Ashida, T., et al., "Effect of electrical properties on thermal diffusivity of amorphous indium zinc oxide films," J. Vac. Sci. Technol. A25 (4), Jul./Aug. 2007, 1178-1183.

Yagi, T., et al., "Analysis on thermal properties of tin doped indium oxide films by picosecond thermoreflectance measurement," J. Vac. Sci. Technol. A 23(4) Jul./Aug. 2005, 1180-1186.

Griffin, A.J. et al., "Effect of thickness on the transverse thermal conductivity of thin dielectric films," J. Appl. Phys. 75(8), Apr. 15, 1994, pp. 3761-3764.

Yanez-Limon, J.M., et al., "Thermal and electrical properties of the Ge:Sb:Te system by photoacoustic and Hall measurements," Physical Review B, 52 (23), Dec. 15, 1995-I, 16 321- 16 324.

* cited by examiner

FIG. 1A  -----"Prior Art"
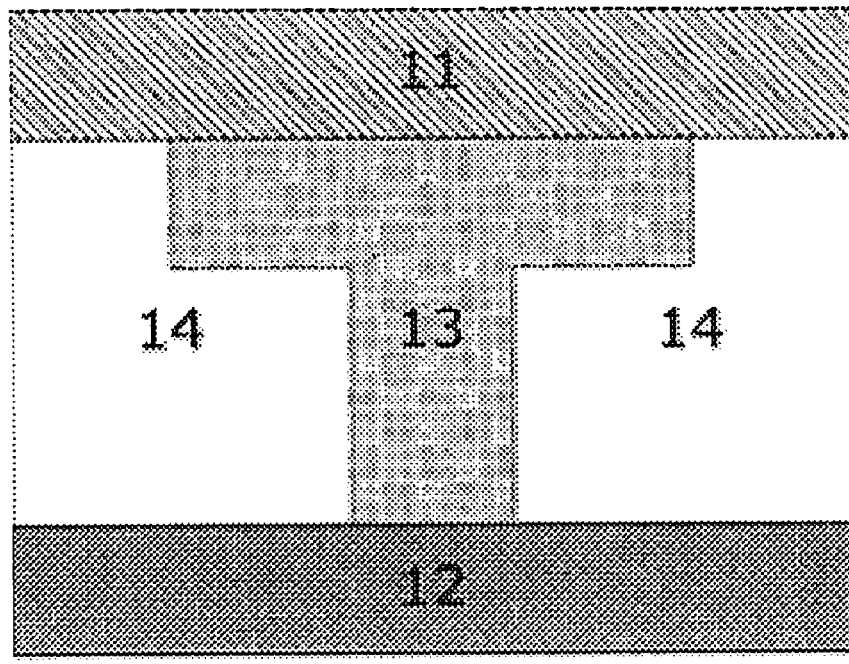
FIG. 1B  -----"Prior Art"
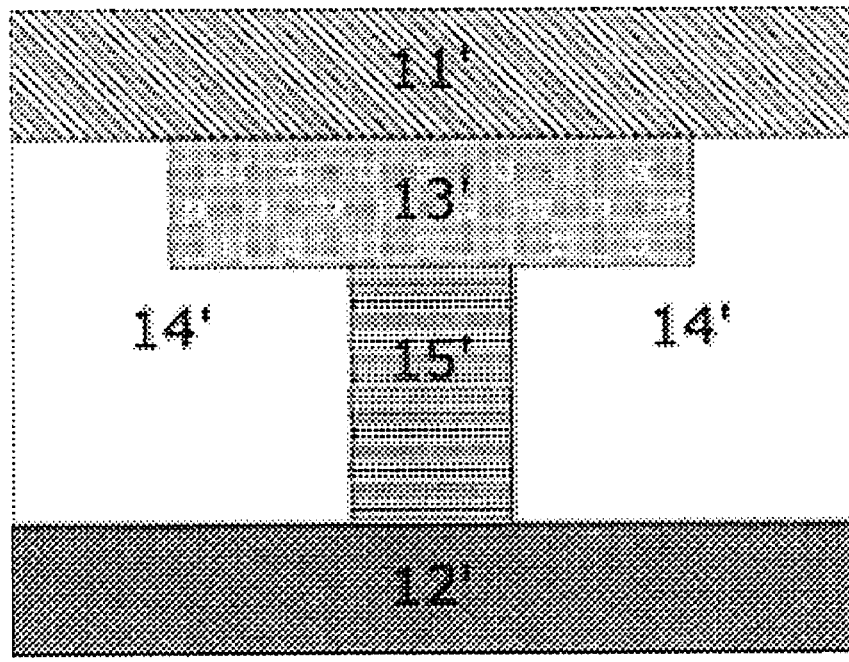

FIG. 2 -----"Prior Art"
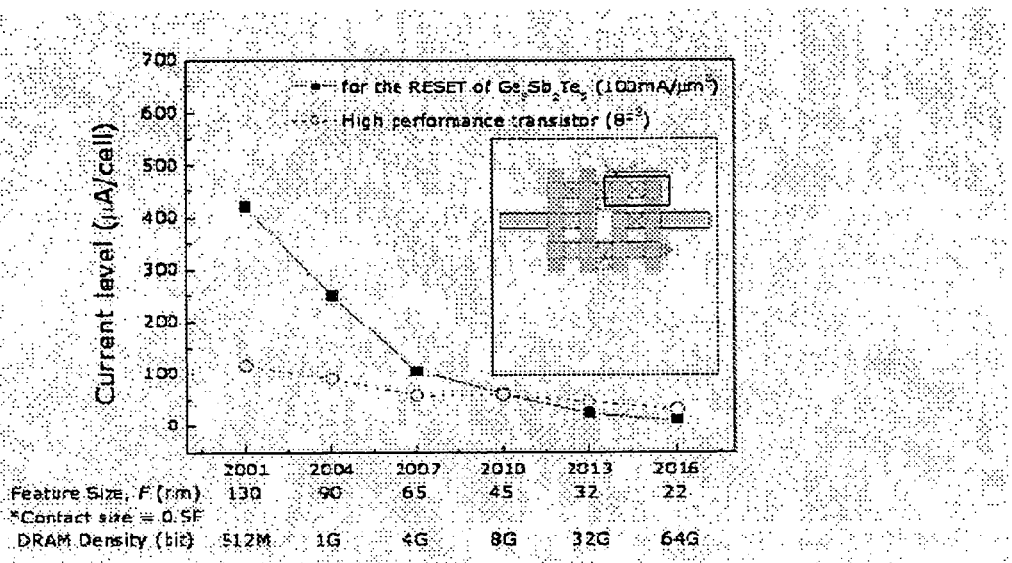

FIG. 4A
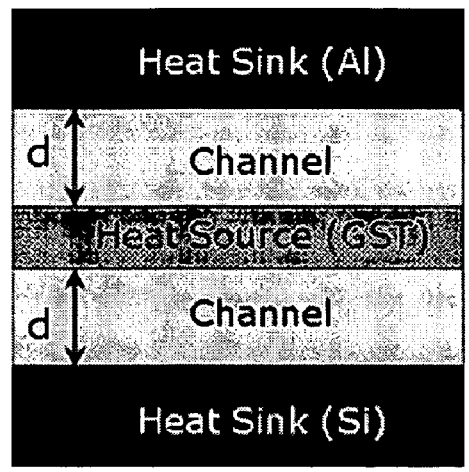
FIG. 4B
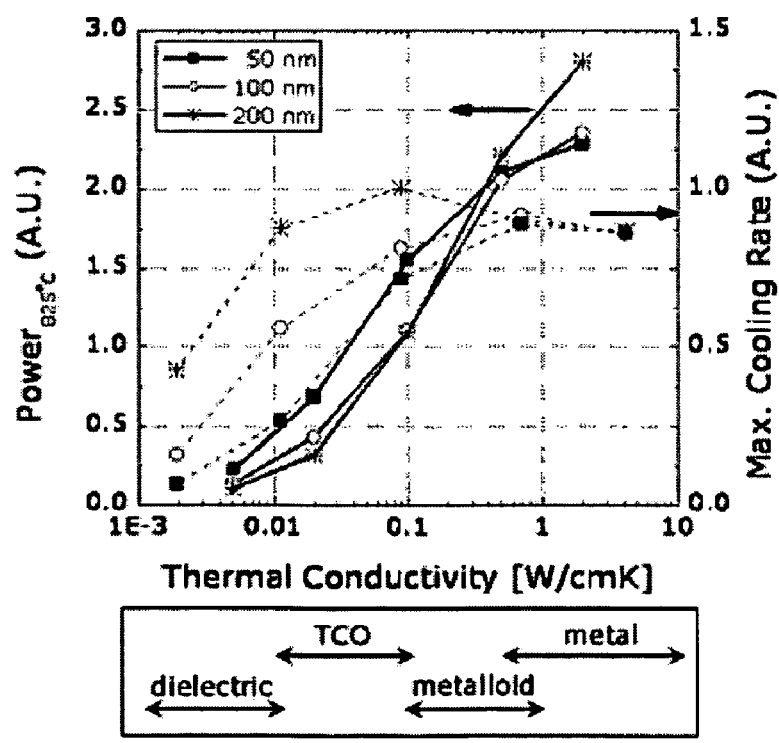
FIG. 5A

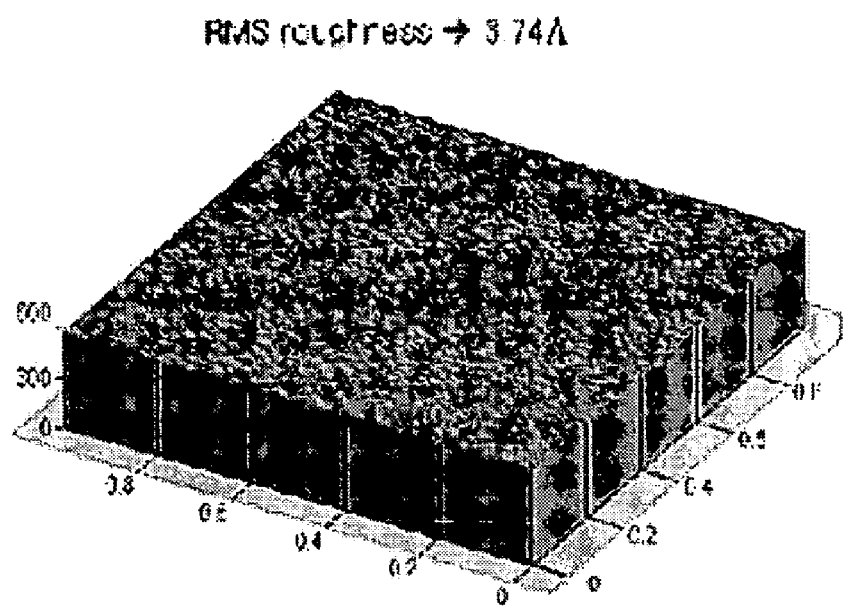
FIG. 6B
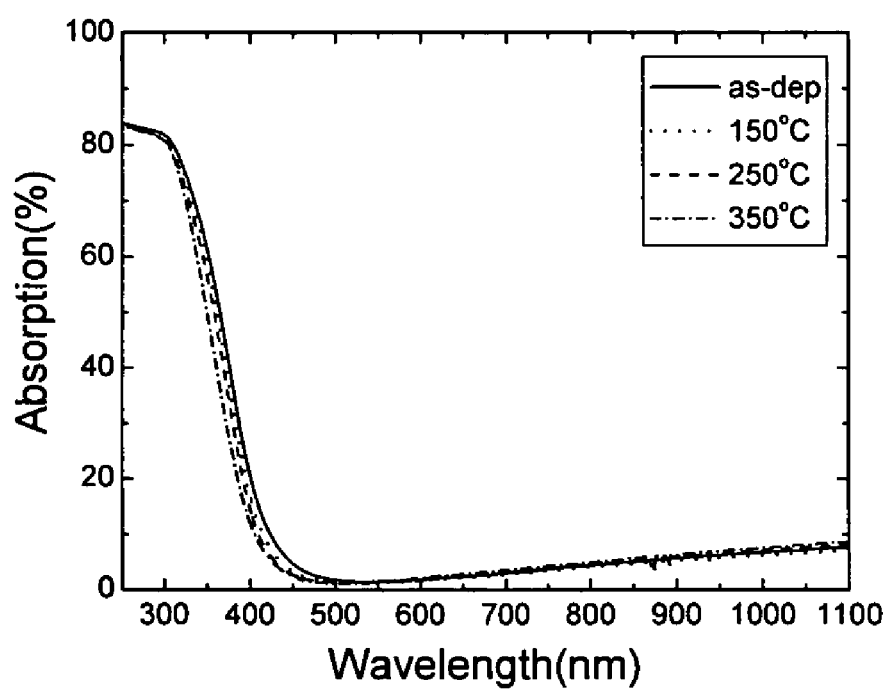

PHASE CHANGE MEMORY CELL WITH TRANSPARENT CONDUCTING OXIDE FOR ELECTRODE CONTACT MATERIAL

FIELD OF THE INVENTION

The present invention relates to a non-volatile phase change memory cell; and, more particularly, to a memory cell employing a transparent conducting oxide-based material as an electrode contact layer.

BACKGROUND OF THE INVENTION

With the recent advancement in the field of high density information storage device, it has become a matter of special interest to develop an optical or electronic memory device through the implementation of a chalcogenide-based phase change material, which is advantageous in that it undergoes fast and reversible phase changes between the crystalline and amorphous states. By exploiting the differences between the crystalline and amorphous states in, e.g., optical reflectance, transmittance and electrical resistance, information storage can be achieved. For instance, the difference in optical characteristics is employed in rewritable CD and DVD optical disks, while non-volatile phase change memory and electrical probe-based memory exploit the difference in the electrical resistance between crystalline and amorphous states.

Specifically, non-volatile phase change memory devices named alternatively OUM (Ovonic Unified Memory), PRAM (Phase-change Random Access Memory), or CRAM (Chalcogenide Random Access Memory) have been actively researched for commercialization as viable substitutes for DRAM.

In FIGS. 1a and 1b, two kinds of non-volatile phase change memory devices are presented.

Basically, they both have top electrodes 11, 11' and bottom electrodes 12, 12' for the input and output of electrical signals; memory areas 13, 13' containing chalcogenide-based phase change materials; and insulating areas 14, 14' for electrical and thermal insulation.

The difference between these two structures is that the memory device of FIG. 1b is further provided with a separate electrode 15' for the joule-heating of the memory area 13'. On the other hand, the memory material itself is responsible for the joule-heating in FIG. 1a, the memory material being disposed in the central enclosed area 13.

When an electric voltage or current pulse is applied between the top and bottom electrodes, there takes place direct or indirect heating to melt the phase change material. At the end of the electric pulse, the melted phase change material is quenched in the form of an amorphous state, achieving information writing. This operation is called a reset operation. To erase this stored information, the electric pulse is applied to the amorphous phase change material such that suitable crystallization conditions in terms of, e.g. heating time and temperature, are met. Once crystallized, the stored information in the memory cell is erased. This operation is called a set operation.

The memory cell presents different electrical resistance depending on whether it is in a crystallized or an amorphous state. The amorphous state presents higher electrical resistance than the crystallized state. Therefore, by sensing the electrical resistance of a memory cell, stored binary information can be read.

Stoichiometric composition of a GeSbTe-based alloy was developed as a practical phase change material capable of electrically switching between the amorphous and crystallized states in a reversible manner. Despite its merits as a non-volatile phase change memory material, the GeSbTe based alloy is disadvantageous in that it has a relatively high melting point of 600° C.~700° C. and possibly a high crystallization temperature (the crystallization temperature is generally ½~⅔ of the melting point on an absolute temperature scale). This is problematic since such a high melting point and possibly a high crystallization temperature, requires more current and power for a reset and a set operation of a phase change memory cell.

Shown in FIG. 2 is the dependency of the current level supplied from a transistor and that needed for a reset operation on the feature size(F) or contact size(0.5 F). The dashed line in FIG. 2 indicates the current level of a transistor supplied to a phase change memory cell having 8 $F^2$ DRAM structure as schematically shown in the incorporated figure. The solid line in FIG. 2 represents the change in the current level needed for a reset operation when the current density level is maintained at 100 mA/$\mu m^2$, which is the value slightly smaller than the current density values estimated from the reset current levels and contact sizes of existing phase change memory prototypes (refer to the results of Intel/Ovonyx in ISSCC 2002 and Samsung Electronics in NVSMW 2003, the current density being 123.5 mA/$\mu m^2$ and 138.9 mA/$\mu m^2$, respectively).

As shown in FIG. 2, the current level supplied from the transistor cannot match the required reset current level until the feature size is reduced down to about 45 nm or smaller.

There might be two options in reducing the current level needed for a reset operation: lowering the melting point of the phase change material used in the memory cell, or enhancing generation/confinement of joule heat by way of changing the materials and the structure of the memory cell.

However, dramatic improvement cannot be expected just by lowering the melting point of the memory material since the melting point of, e.g., 900 K needs to be cut down to the level of about half (450 K) just to save 50% of the electric power. Accordingly, a practical approach would be to look for an optional material/structure for other parts of the memory cell, thereby optimizing heating and thermal dissipation characteristics of the memory material during reset/set process.

To establish an electrical current path in the phase change memory device, the memory area must be in contact with electrodes. Electrodes may be connected directly to the memory area or through electrode contact layers. As shown in FIGS. 3a and 3b, electrode contact layers 26, 27, 26', 27' are disposed between memory materials 23, 23' and electrodes 21, 21', 22, 22', 25' to block material diffusion therebetween.

Amorphous carbon, amorphous silicon or amorphous C/Si double structure was employed as an electrode contact layer in Ovonic EEPROM (Electrically Erasable Programmable Read Only Memory). It was also proposed to pile carbon and molybdenium layers to use as an electrode contact layer. Another exemplary material for electrode contact layer is combinations of: the material selected from the group consisting of Ti, V, Cr, Nb, Mo, Ha, Ta, W and mixtures or alloys thereof; and two or more elements selected from the group consisting of B, C, N, O, Al, Si, P and S. Examples of Such combination encompass TiCN, TiAlN TiSiN, W—$Al_2O_3$ and Cr—$Al_2O_3$.

Heat dissipation from the memory area is affected by such factors as what constitutes electrode/electrode contact layers and how memory area is insulated from surroundings. Materials such as Al, Cu, Ti, Mo, W, Poly-Si, TiW, TiN and TiAlN are typically employed as electrodes/electrode contact layers. Electrical conductivities of these materials are relatively high $10^3$~$10^6$ $\Omega^{-1}cm^{-1}$. However, these materials also have a high thermal conductivity, almost several tens or hundreds of times higher than that of a GeSbTe alloy material or an insulating material for a memory device. Accordingly, phase change memory devices employing these materials as electrodes tend to have large heat dissipation during the reset/set process and, as a result, more power is needed to elevate the temperature of the memory area over the melting point or crystallization temperature thereof.

Further, mutual diffusion might happen between the memory material and the above mentioned electrodes/electrode contact materials when heated above melting/crystallization temperature. Under the circumstance, it is hard to expect that such a memory device would function in a stable manner Accordingly, there existed a need to find new materials for use in electrodes/electrode contact layers that will lessen power consumption and improve operational stability of the memory device.

SUMMARY OF THE INVENTION

It is, therefore, an object of the present invention to provide a thermally stable electrode contact material for use in a non-volatile phase change memory incurring less power consumption during reset/set operation of the memory, and a device using the same.

In accordance with the present invention, there is provided a non-volatile phase change memory cell comprising an electrode contact layer disposed between an electrode layer and a phase change memory layer, wherein the electrode contact layer includes a transparent conducting oxide-based semiconducting material having an electrical conductivity of $10^2$ $\Omega^{-1}\text{cm}^{-1}$ or more and a thermal conductivity ($\kappa$) of 0.2 W/cm·K or less.

The transparent conducting oxide-based material employed in the present invention is non-reactive with electrode or phase change memory material, and chemically and physically stable at reset/set temperatures in the range of 100° C.–1,000° C.

BRIEF DESCRIPTION OF THE DRAWINGS

The above and other objects and features of the present invention will become apparent from the following description of preferred embodiments given in conjunction with the accompanying drawings, in which:

FIGS. 1a and 1b describe schematic diagrams of non-volatile phase change memory cells;

FIG. 2 shows changes in the current level supplied from a transistor and that needed for storing information in a memory cell as functions of feature size (F) and contact size (0.5 F);

FIGS. 4a and 4b respectively depict a schematic diagram of a phase change memory cell, and a graph showing the relationships between power consumption and thermal conductivity of the electrode contact material measured in the phase change memory cell;

FIGS. 5a and 5b respectively accord a schematic diagram of a phase change memory cell having a plug type electrode structure of FIG. 1a, and a graph showing the relationships between power consumption and thermal conductivity of the electrode contact material measured in this memory cell;

FIGS. 6a, 6b and 6c respectively describe an AFM (atomic force microscope) image of an IZO (Indium Zinc Oxide) thin film deposited at room temperature, and the light absorption (%) and the electrical resistivity of the IZO film with respect to annealing temperature;

DETAILED DESCRIPTION OF THE PREFERRED EMBODIMENTS

Figure 3A:
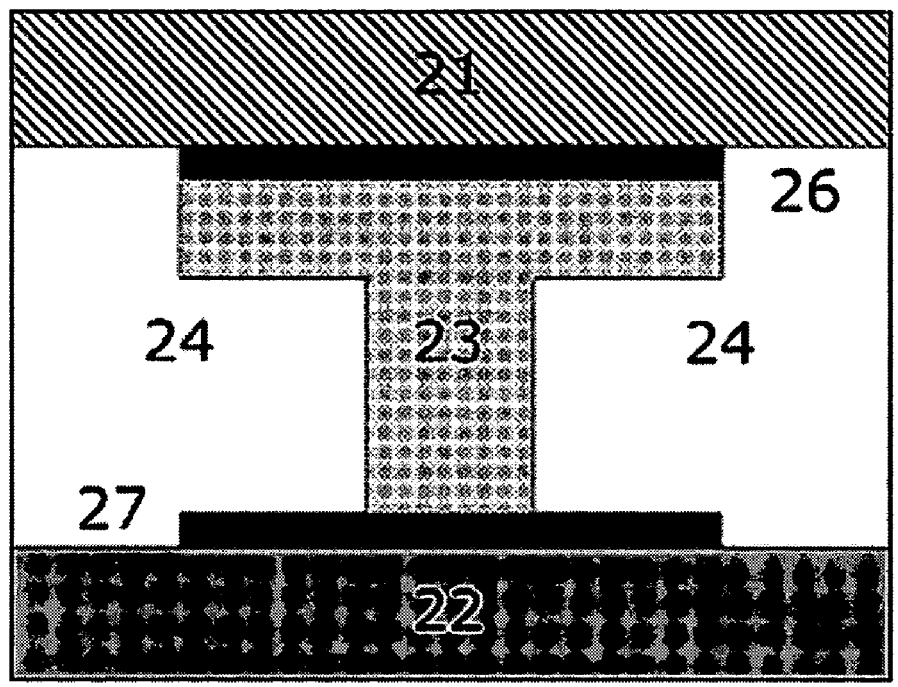
FIGS. 3a and 3b illustrate sectional views of the phase change memory cells comprising electrode contact layers.

The preferred embodiment of the present invention will now be explained.

First, in accordance with the present invention, the electrode contact materials of the present invention are characterized by having a relatively high electrical conductivity of $10^2$ $\Omega^{-1}\text{cm}^{-1}$ or more and a low thermal conductivity ($\kappa$) of 0.2 W/cm·K or less.

The thermal conductivity $\kappa$ of a material is primarily affected by electron and phonon. The bigger the electrical conductivity of the material is, the higher the influence of the electron part becomes. Wiedemann-Frantz law provides the formula accounted for by the electron part as follows:

$$\sigma/\kappa_e LT$$

wherein $\sigma$ and $\kappa_e$ correspond to electrical and thermal conductivities for electron, respectively, and L and T correspond to Lorentz constant and temperature, respectively.

The Lorentz constant of a metallic material remains constant and, accordingly, thermal conductivity is proportional to the electrical conductivity when the temperature remains the same. Aluminum, a typical metal used in metal connections, has the highest electrical conductivity among metals. Most metallic materials show electrical conductivities of more than 1/10 that of aluminum, rendering it difficult to lower the thermal conductivity of a metallic material below one tenth that of aluminum.

Accordingly, the present invention employs a semiconducting material in the electrode contact layer. The thermal conductivity of a semiconducting material varies depending on many factors such as the degree of doping, Fermi energy, band gap and scattering mechanism of carriers (i.e., electrons or electron holes). Generally, the scattering of phonons gets bigger when the semiconductor is highly doped due to the presence of the impurities and densely populated carriers. Phonons primarily account for the thermal conductivity in the high temperature area and, accordingly, a significant decrease in thermal conductivity can be expected of a highly-doped semiconducting material at elevated temperatures.

The electrode contact materials of the present invention must be physically, chemically and thermally stable since the temperature of the adjoining memory area is elevated over the melting point or crystallization temperature of the memory material during reset/set process. Further, at this high temperature, the electrode contact material must be able to prevent mutual diffusions between itself and the memory material.

Materials satisfying these conditions include oxides, nitrides or carbides with covalent or ionic bondings. Accordingly, in the present invention, it is preferred that the transparent conducting oxide-based semiconducting material is an oxide of a metal selected from the group consisting of Zn, Cd, Ga, In, Ti, Sn, Pb, Sb and a mixture thereof. More preferably, the transparent conducting oxide-based semiconducting material is a metal-oxide binary system such as ZnO, CdO, $Ga_2O_3$, $In_2O_3$, $Ti_2O_3$, $SnO_2$, $PbO_2$ and $Sb_2O_5$.

Even more preferably, the inventive electrode contact material is a metal-oxide binary system doped with a trace amount of an element such as CdO:In, $In_2O_3$:Sn, $SnO_2$:Sb, $SnO_2$:Cl, $SnO_2$:F and ZnO:X (X=In, Al, B, Ga, F, Y, Sc, Si, Ge, Ti, Zr, Hf); a metal-oxide ternary system such as $Cd_2SnO_4$, $Cd_2InO_4$, $Zn_2SnO_4$, $ZnSnO_3$, $Zn_2In_2O_5$, $MgIn_2O_4$, $GaInO_3$, $In_4Sn_3O_{12}$, $CuAlO_2$, $CuGaO_2$, $CuInO_2$, $AgAlO_2$, $AgGaO_2$, $AgInO_2$ and $SrCu_2O_2$; or mixtures thereof. Further examples of the electrode contact materials useful in the present invention include metal-oxide quaternary systems such as $In_{1-x}Ga_{1+x}O_3(ZnO)_k$ (k=1; −0.34<X<0.06, k=2; −0.54<X<0.3, k=3; −1<X<0.42), $Ga_{3-x}In_{5+x}Sn_2O_{16}$ (0.3<X<1.6), $In_{2-2x}Sn_xZn_xO_3$ (0<X<0.4), $Cd_{1+x}In_{2-2x}S_{n_x}O_4$ (0<X<0.75) and $In_{2-2x}Sn_xCd_xO_3$ (0<X<0.34).

For example, indium oxide doped with Sn (indium tin oxide; ITO) has a high electrical conductivity of $2 \times 10^3$ $\Omega^{-1}cm^{-1}$ and a low thermal conductivity κ of 0.085 W/cm·K. On the other hand, TiAlN, a conventional electrode contact material, shows electrical and thermal conductivities of about $5 \times 10^2$ $\Omega^{-1}cm^{-1}$ and about 0.3 W/cm·K, respectively.

To illustrate the influence of the thermal conductivity of the electrode contact material on the thermal characteristics of a device, a computer simulation was conducted on the structure shown in FIG. 4a. A temperature analysis model suggested for optical recording by C. Peng is incorporated herein by reference for the part dealing with the temperature change due to optical absorption and heat dissipation (C. Peng et al., J. Appl. Phys., 82, 4183 (1997)). Results are shown in FIG. 4b where the thermal conductivity range of the electrode contact layer is arbitrarily chosen between supposedly the highest thermal conductivity and the lowest, i.e., about 2 W/cm·K of aluminum and about 0.002 W/cm·K of a polycarbonate or an amorphous chalcogenide material.

The structure of FIG. 4a is IZO (d nm)/GeSbTe (25 nm)/IZO (d nm) stacked on a Si substrate (d=50, 100, 200 nm). A 680 nm laser pulse was applied through a 0.6-NA objective lens for the duration of 100 ns. The laser power for elevating the temperature of the center portion of the phase change material to 200° C. over its melting point (625° C.) was calculated along with the cooling speed thereof upon termination of the pulse. The specific heat (C) and the thermal conductivity (κ) used in the calculation are shown in Table 1.

TABLE 1

|  | Si | Al | GeSbTe |
|---|---|---|---|
| C (J/cm³ · K) | 1.61 | 2.4508 | 1.287 |
| k (W/cm · K) | 1.41 | 2.1465 | 0.005 |

* Specific heat(C.) of electrode contact layer was fixed at 2.052.

Referring to FIG. 4b, when the thicknesses of the electrode contact layers are identical, a transparent conducting oxide-based material can save twice as much power as a conventional metallic material. Further, the cooling speed of the melted phase change material during the recording process can be controlled with much ease by changing the thickness of the electrode contact layer comprising a transparent conducting oxide-based material.

Figure 3B:
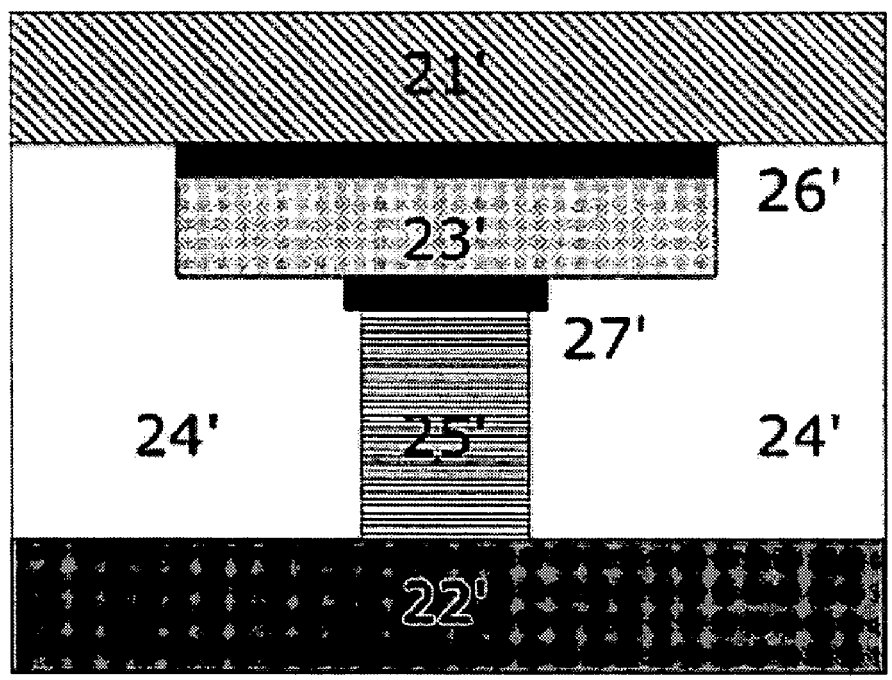

As shown in FIGS. 3a and 3b, the transparent conducting oxide semiconducting material of the present invention can be applied to the electrode contact layers 26, 26' disposed between the top electrodes 21, 21' and memory areas 23, 23', and to the electrode contact layers 27, 27' disposed between memory areas 23, 23' and bottom electrodes 22, 22'.

Specific aspects of the present invention are further illustrated through the following Examples, without limiting the scope thereof.

EXAMPLE 1

Figure 5B:
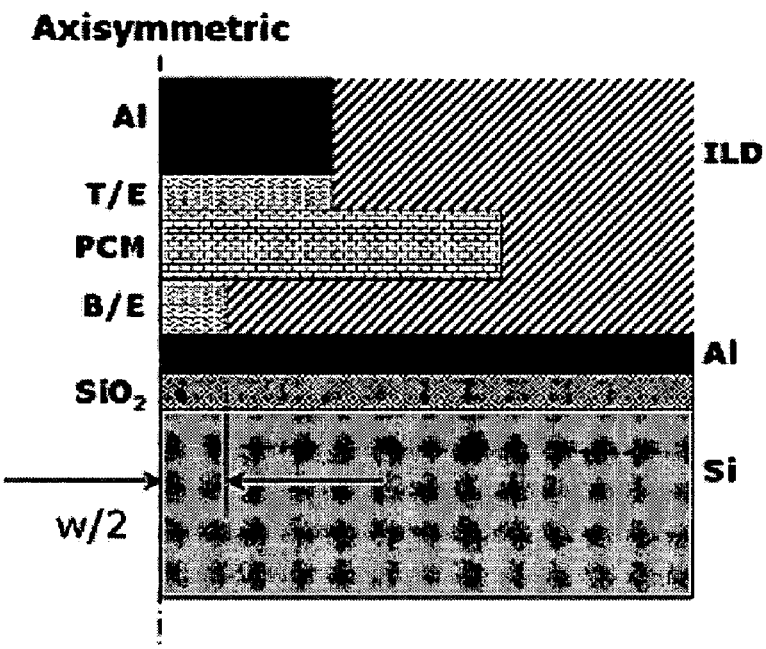

Aside from the general thermal characteristics shown in FIG. 4, the thermal efficiency of a practical phase change memory cell was studied that has a plug type electrode structure as shown in FIG. 5a. To understand the relationship between the thermal characteristics of this structure and the thermal conductivity of the electrode/electrode contact materials, a graph shown in FIG. 5b was drawn by way of thermal calculations using a finite element method. Shown in FIG. 5b is the dependency of the electric power needed for elevating the temperature of the phase change material (PCM) above its melting temperature on the thermal conductivities of the top/bottom electrode materials for a varying bottom electrode (B/E) contact size (diameter) of 60 nm, 150 nm and 300 nm when an electrical pulse of a 40 ns duration time was applied to the top electrode (T/E). For these calculations, the thermal conductivity range of the electrode contact layer was set at between the highest thermal conductivity and the lowest known in the art, i.e., about 2 W/cm·K for aluminum and about 0.002 W/cm·K for a polycarbonate or an amorphous chalcogenide material.

The results in FIG. 5b were similar to those in FIG. 4b in that the power-saving effect varies inversely proportional to the thermal conductivities of the top/bottom electrodes. Further, the smaller the contact size is, the bigger the power-saving effect becomes. This feature can be extremely advantageous in a highly integrated memory for the obvious reason.

EXAMPLE 2

Figure 6A:
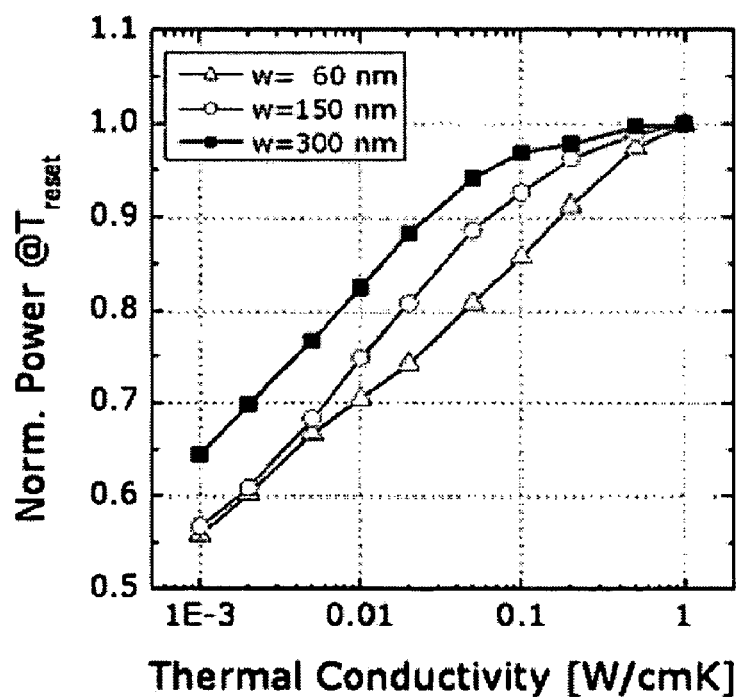

An indium zinc oxide (IZO)-based target having the composition of $In_2O_3$-10 wt % $ZnO_2$ (US Cerac Inc.) was employed as a transparent conducting oxide-based semiconducting material. In forming the IZO film by the RF magnetron sputtering method, a mixed gas of Ar and 0.5% by volume of $O_2$ was employed as a sputter gas, and the film was formed to a thickness of 100 nm on a glass substrate. As shown in FIG. 6a, the image of Atomic Force Microscope (PSI CP model) revealed that the surface of the IZO film is very smooth, the RMS value of the surface roughness being about 3.74 Å.

Figure 6C:
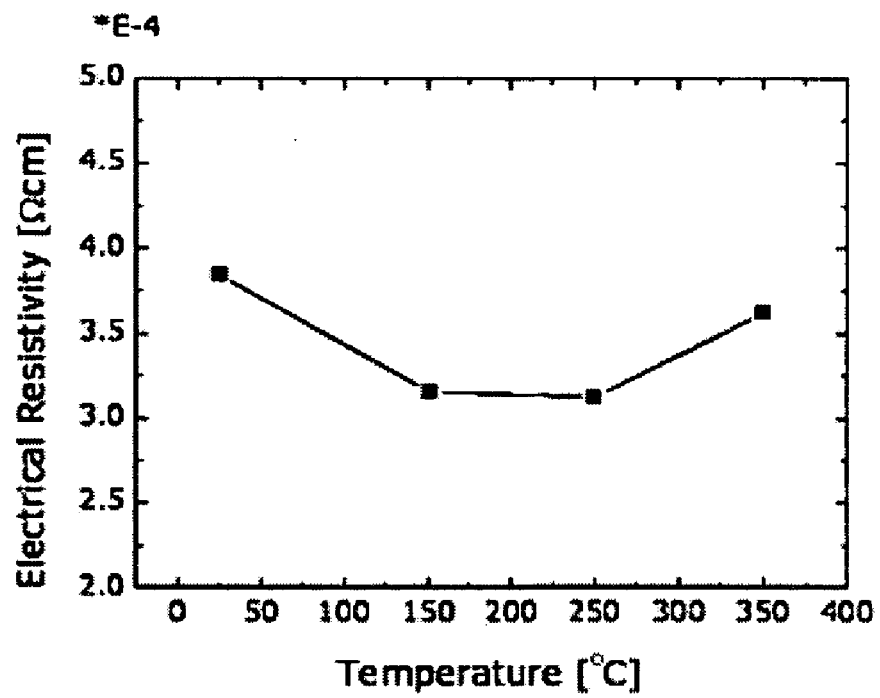

To check the thermal stability of the IZO film as the temperature was elevated during the reset/set process, the IZO film deposited at room temperature was annealed for one hour at 150° C., 250° C. and 350° C., respectively by RTA (Rapid Thermal Annealing) under 1.5 Torr Ar atmosphere. The optical absorption and resistivity of the film were measured thereafter, as the results obtained therefrom are shown in FIGS. 6b and 6c, respectively. To obtain the light absorption, light reflectance and transmittance were measured with Spectrophotometer Lamda model 35 (Perkin Elmer Inc.) at wavelengths of 250 nm-1100 nm with an interval of 1 nm and were subtracted from the intensity of the incident light normalized to 100%. The electrical resistivity of the film was measured using a four-point probe Loresta-GP model (Mitsubishi Chemical Co.). As shown in FIGS. 6b and 6c, no significant changes in the optical characteristics occurred following the heat treatment, and the resistivity remained unchanged in the range of $3 \sim 4 \times 10^{-4}$ $\Omega \cdot$cm throughout the experimental temperature range.

EXAMPLE 3

Figure 7A:
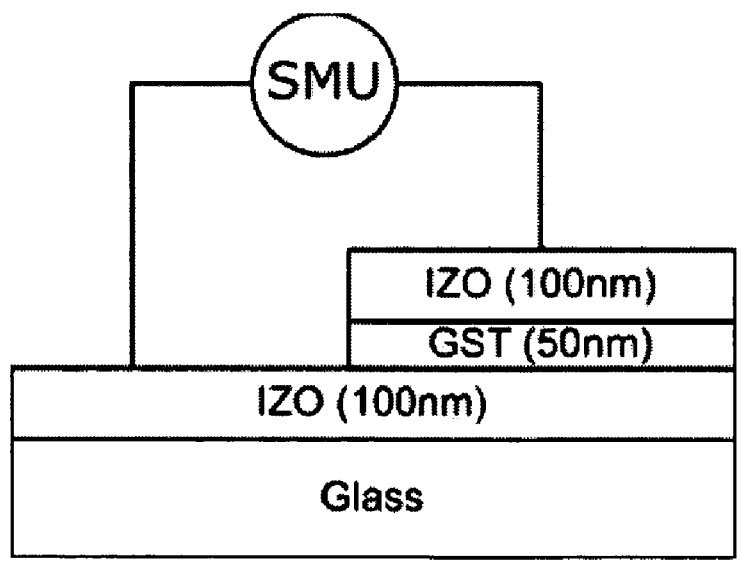
FIG. 7a sets forth a sectional view of a sample device for analyzing electrical characteristics, the device being IZO(100 nm)/GeSbTe(50 nm)/IZO(100 nm) stacked on a glass substrate in that order.

To analyze the electrical characteristics of a memory device employing IZO, a three layered sample device of FIG. 7a was manufactured, which had the structure of IZO (100 nm)/GeSbTe (50 nm)/IZO (100 nm) stacked on a glass substrate. Specifically, GeSbTe and IZO films were formed on an IZO bottom electrode layer in that order using a metal shadow mask with a 2 mm-circular hole. The GeSbTe film was formed using a RF magnetron sputtering method with a target having the composition of $Ge_1Sb_2Te_4$ (Mitsubishi Chemical Co., Japan). The electric characteristics of the prepared sample device were estimated from the I–V curve measured with Keithley SMU (Source Measure Unit) model 236.

Figure 7B:
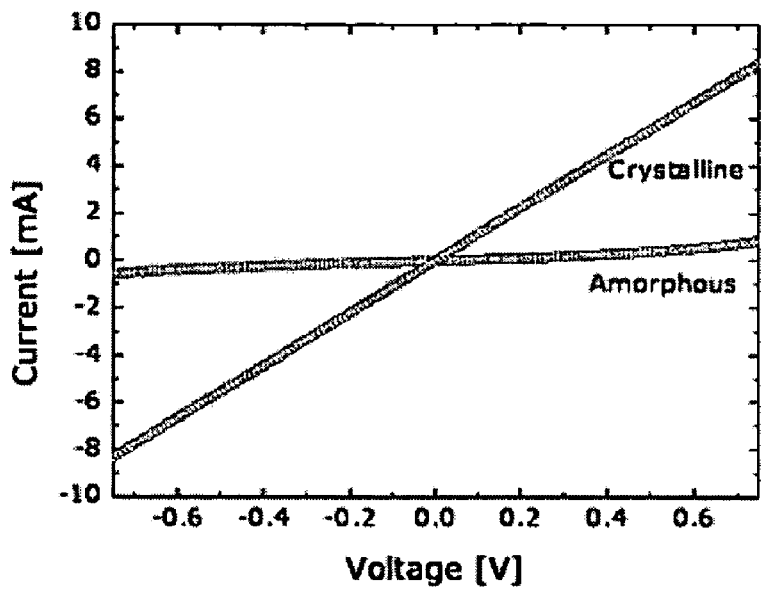
FIG. 7b exhibits an I–V curve of an amorphous state GeSbTe film of FIG. 7a after its film formation, and that of the crystallized film obtained by heat treatment while changing the voltage from –0.75 V to 0.75 V at an interval of 0.1 V.

FIG. 7b shows one of the I–V curves (0.1 V interval) of the amorphous state of an as-deposited GeSbTe film, together with that of the crystallized state after heat treatment, which were obtained for low voltages from –0.75 V to 0.75 V at a 0.1 V interval to prevent the change in the properties of the films at the respective state. The results of FIG. 7b show that the I–V curve is linear and symmetric in the measured range regardless of the phase state of the film, which indicates that IZO satisfies the characteristics required of an ohmic contact and is a proper electrode contact material.

Figure 7C:
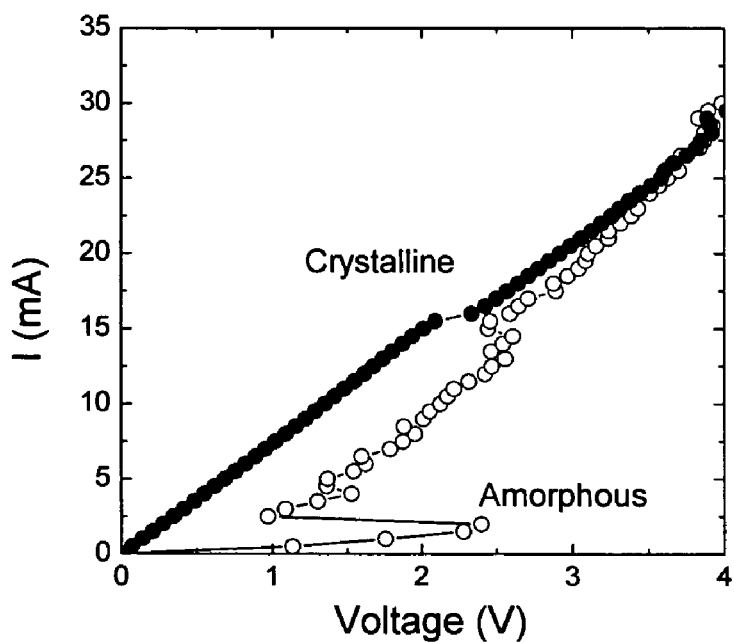
FIG. 7c represents I–V curves of the GeSbTe film device sample of FIG. 7a for its amorphous and crystallized states as a result of electrical switching thereof.

FIG. 7c shows I–V curves of the sample device at the amorphous and crystallized states obtained by measuring the voltage change while increasing the current. According to the curve of the sample in an amorphous state, the voltage increases with the increase in the current until it decreases rapidly with negative resistances beyond a point of certain characteristic voltage (threshold voltage), and next, it again increases following the trace of low resistances. Once the current level becomes higher than 15 mA, the I–V curve matches that of the sample in a crystallized state, which indicates that the crystallization process is complete. This test conducted with an amorphous sample confirmed the same electric switching as reported in the devices with conventional electrode structures.

EXAMPLE 4

IZO (100 nm) and GeSbTe (50 nm) films were formed on a glass substrate, and then, as a top electrode, a TiN film (100 nm) was formed thereon by reactive sputtering method using a Ti target under $N_2$ atmosphere.

Figure 8:
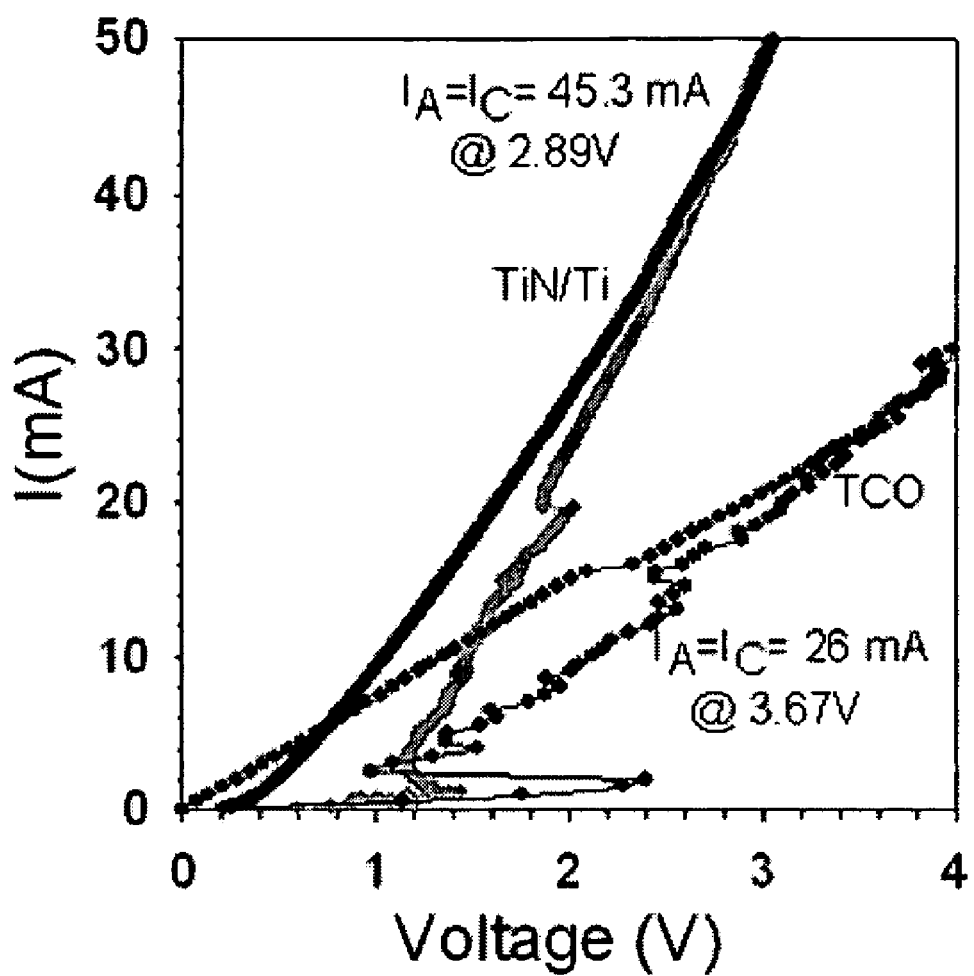
FIG. 8 demonstrates an I–V curve of the device of FIG. 7a when IZO is replaced by TiN, the I–V curve being expressed as an overlap over the I–V curves of FIG. 7c.

FIG. 8 shows an I–V curve for this sample device obtained by the methods illustrated in Example 3, the I–V curve being expressed as an overlap over FIG. 7c.

When compared with the I–V curves of FIG. 7c, the slopes of the TiN-replaced I–V curves reveal that the resistance of the device decreased for both amorphous and crystalline states. Further, referring to the point where the amorphous-crystalline state switching is completed, the current level increases (from 26 to 45.3 mA) and voltage decreases (from 3.67 to 2.89 V) relative to those observed for the IZO electrode.

Figure 9:
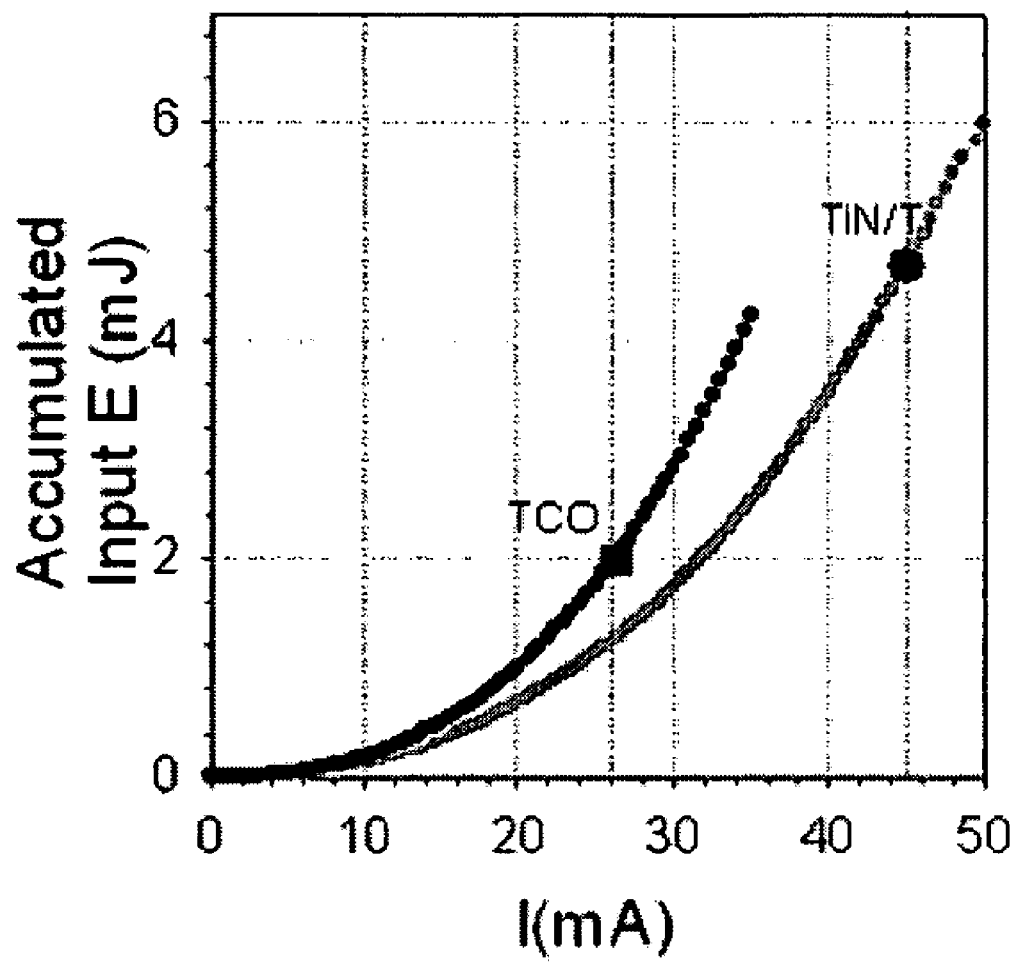
FIG. 9 offers the electrical energy accumulated from the beginning of the current application until the completion of the crystallization, calculated from the I–V curves of FIG. 8.

FIG. 9 shows the electrical energy accumulated from the beginning of the current application until the completion of the crystallization, calculated from the I–V curves of FIG. 8. The result in FIG. 9 shows that the use of the IZO transparent conducting oxide semiconducting material as an electrode results in about 50% or less electrical energy consumption for completion of the crystallization, as compared to the case when a TiN electrode was employed.

While the invention has been shown and described with respect to the preferred embodiment, it will be understood by those skilled in the art that various changes and modification may be made without departing from the spirit and scope of the invention as defined in the following claims.

What is claimed is:

1. A non-volatile phase change memory cell comprising
an electrode layer for wiring;
a phase change memory layer; and
an electrode contact layer disposed between the electrode layer and the phase change memory layer,
wherein, the electrode contact layer comprises indium zinc oxide (IZO) which has an electrical conductivity of $10^2 \Omega^{-1} cm^{-1}$ or more and a thermal conductivity (K) of 0.2 W/cm·K or less; and wherein, coefficient of thermal conductivity (k) of the electrode contact layer is higher than the coefficient of thermal conductivity (k) of the phase change memory layer.

* * * * *